(12) United States Patent
Kurokawa (10) Patent No.: US 8,987,651 B2
(45) Date of Patent: Mar. 24, 2015

(54) PHOTODETECTOR INCLUDING PHOTODIODES OVERLAPPED WITH EACH OTHER

(75) Inventor: Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 427 days.

(21) Appl. No.: 13/253,455

(22) Filed: Oct. 5, 2011

(65) Prior Publication Data

US 2012/0085890 A1    Apr. 12, 2012

(30) Foreign Application Priority Data

Oct. 7, 2010   (JP) .................................. 2010-227467

(51) Int. Cl.
*G01J 1/44* (2006.01)
*H01L 27/146* (2006.01)

(52) U.S. Cl.
CPC ................................ *H01L 27/14678* (2013.01)
USPC ..................................................... 250/214 R

(58) Field of Classification Search
CPC .................... H01L 27/14652; H01L 27/14647
USPC ......................................... 250/214 R, 339.05
See application file for complete search history.

(56) References Cited

U.S. PATENT DOCUMENTS

| | | | |
|---|---|---|---|
| 4,238,760 A * | 12/1980 | Carr | 257/443 |
| 4,438,455 A | 3/1984 | Tabei | |
| 5,965,875 A | 10/1999 | Merrill | |
| 6,271,943 B1 * | 8/2001 | Goossen | 398/9 |
| 6,747,638 B2 | 6/2004 | Yamazaki et al. | |
| 7,271,835 B2 | 9/2007 | Iizuka et al. | |
| 7,411,620 B2 | 8/2008 | Taniguchi et al. | |
| 7,525,523 B2 | 4/2009 | Yamazaki et al. | |
| 7,663,165 B2 | 2/2010 | Mouli | |
| 7,674,650 B2 | 3/2010 | Akimoto et al. | |
| 7,893,932 B2 * | 2/2011 | Kobashi | 345/207 |

(Continued)

FOREIGN PATENT DOCUMENTS

| | | | |
|---|---|---|---|
| JP | 03284883 A | * | 12/1991 |
| JP | 2007-65239 | | 3/2007 |

(Continued)

OTHER PUBLICATIONS

Tanaka, K. et al, "45.5: A System LCD with Optical Input Function Using Infra-Red Backlight Subtraction Scheme," SID Digest '10: SID International Symposium Digest of Technical Papers, 2010, pp. 680-683.

(Continued)

*Primary Examiner* — Thanh Luu
(74) *Attorney, Agent, or Firm* — Husch Blackwell LLP (57) ABSTRACT

An object is to reduce the size and manufacturing cost of a photodetector. In order to reduce the area where a visible light sensor and an infrared light sensor are provided, a first photodiode that detects visible light and a second photodiode that detects infrared light are arranged to overlap with each other so that visible light is absorbed first by the first photodiode, whereby significantly little visible light enters the second photodiode. Further, the first photodiode overlapping with the second photodiode is used as an optical filter for the second photodiode. Therefore, a semiconductor layer included in the first photodiode absorbs visible light and transmits infrared light, and a semiconductor layer included in the second photodiode absorbs infrared light.

21 Claims, 6 Drawing Sheets

(56) References Cited

U.S. PATENT DOCUMENTS

| | | |
|---|---|---|
| 2003/0209651 A1 | 11/2003 | Iwasaki |
| 2006/0157760 A1 | 7/2006 | Hayashi et al. |
| 2006/0231913 A1* | 10/2006 | Wilsey et al. ............... 257/461 |
| 2007/0018075 A1 | 1/2007 | Cazaux et al. |
| 2008/0054319 A1 | 3/2008 | Mouli |
| 2009/0101948 A1 | 4/2009 | Park et al. |
| 2009/0295769 A1 | 12/2009 | Yamazaki et al. |
| 2010/0117991 A1 | 5/2010 | Koyama et al. |
| 2010/0182282 A1 | 7/2010 | Kurokawa et al. |
| 2010/0225628 A1* | 9/2010 | Souchkov et al. ............ 345/207 |

FOREIGN PATENT DOCUMENTS

| | | |
|---|---|---|
| JP | 2009-187342 | 8/2009 |
| JP | 2009-187342 A | 8/2009 |
| WO | WO 2010/084640 A1 | 7/2010 |

OTHER PUBLICATIONS

Jeon, S. et al, "180nm Gate Length Amorphous InGaZnO Thin Film Transistor for High Density Image Sensor Applications," IEDM 10: Technical Digest of International Electron Devices Meeting, Dec. 6, 2010, pp. 504-507.

* cited by examiner

PHOTODETECTOR INCLUDING PHOTODIODES OVERLAPPED WITH EACH OTHER

BACKGROUND OF THE INVENTION

1. Field of the Invention

The present invention relates to a photodetector, a display device including the photodetector, and an electronic device including the photodetector.

2. Description of the Related Art

In resent years, a touch panel in which a device including a circuit that detects light (also referred to as a "photodetector") and a pixel circuit of a display device are formed in an integrated manner has attracted attention. For example, Patent Document 1 discloses a liquid crystal display device in which an optical sensor element that detects the intensity of visible light (hereinafter referred to as a visible light sensor) and an optical sensor element that detects the intensity of infrared light (hereinafter referred to as an infrared light sensor) are disposed in a display panel.

In the structure of Patent Document 1, a touch panel function with high accuracy is realized by disposing the visible light sensor and the infrared light sensor. With the structure, even when the detection accuracy of the visible light sensor is decreased by noise due to light such as outside light depending on the environment under which the liquid crystal display device is placed, infrared light that is not influenced by visible light is detected by the infrared light sensor with photosensitivity different from that of the visible light sensor; thus, accurate positional detection is achieved under a wide range of environmental illuminance.

REFERENCE

Patent Document

[Patent Document 1] PCT International Publication No. 2010/084640

SUMMARY OF THE INVENTION

In a structure as disclosed in Patent Document 1 where a visible light sensor and an infrared light sensor are disposed in a display panel, the area in a display portion where the sensors are provided is increased and thus the pixel size is increased. Moreover, in the case where an infrared light sensor is used as disclosed in Patent Document 1, an optical filter needs to be provided to reduce noise due to entry of visible light into the infrared light sensor, which may cause an increase in manufacturing cost.

An object of one embodiment of the present invention is to provide a photodetector in which a visible light sensor and an infrared light sensor are disposed and in which the area where the sensors are provided is shared so that the area occupied by the sensors and the pixel size can be reduced. Another object of one embodiment of the present invention is to reduce manufacturing cost by not providing an optical filter for suppressing entry of visible light in the case where an infrared light sensor is used.

In one embodiment of the present invention, in order to reduce the area where a visible light sensor and an infrared light sensor are provided, a first photodiode that detects visible light and a second photodiode that detects infrared light are arranged to overlap with each other so that visible light is absorbed first by the first photodiode, whereby significantly little visible light enters the second photodiode. Further, in one embodiment of the present invention, the first photodiode overlapping with the second photodiode is used as an optical filter for the second photodiode. Therefore, a semiconductor layer included in the first photodiode absorbs visible light and transmits infrared light, and a semiconductor layer included in the second photodiode absorbs infrared light.

One embodiment of the present invention is a photodetector including a first photodiode configured to detect visible light, a second photodiode configured to detect infrared light, a first amplifier circuit configured to amplify electric charge accumulated in accordance with photocurrent in the first photodiode and to output the amplified electric charge, and a second amplifier circuit configured to amplify electric charge accumulated in accordance with photocurrent in the second photodiode and to output the amplified electric charge. A semiconductor layer of the first photodiode includes amorphous silicon. A semiconductor layer of the second photodiode includes crystalline silicon. The first photodiode and the second photodiode are provided to overlap with each other so that the first photodiode is positioned on a side where incident light including visible light and infrared light enters. The first photodiode absorbs the visible light of the incident light and transmits the infrared light. The second photodiode absorbs the infrared light of the incident light, which is transmitted through the first photodiode.

One embodiment of the present invention may be a photodetector in which the semiconductor layer of the second photodiode is provided in the same layer as semiconductor layers of transistors included in the first amplifier circuit and the second amplifier circuit.

One embodiment of the present invention may be a photodetector in which the semiconductor layer of the first photodiode includes a p-type semiconductor region, an i-type semiconductor region, and an n-type semiconductor region; and the p-type semiconductor region, the i-type semiconductor region, and the n-type semiconductor region are stacked to form the first photodiode.

One embodiment of the present invention may be a photodetector in which the second photodiode includes a p-type semiconductor region, an i-type semiconductor region, and an n-type semiconductor region; and the area where the first photodiode overlapping with the second photodiode is provided is larger than the area where the i-type semiconductor region in the second photodiode is provided.

One embodiment of the present invention may be a photodetector in which each of the first amplifier circuit and the second amplifier circuit includes a first transistor, a second transistor, and a third transistor; the second transistor and the third transistor are electrically connected in series between a power supply line and an output signal line; a gate of the second transistor is electrically connected to a first terminal of the first transistor; and a second terminal of the first transistor is electrically connected to one electrode of the photodiode.

According to one embodiment of the present invention, a photodetector in which a visible light sensor and an infrared light sensor are disposed and in which the area where the sensors are provided is shared so that the occupied area and the pixel size are reduced can be provided. Consequently, the area of each sensor can be relatively increased, and thus the sensitivity of the sensors to visible light and infrared light can be improved. According to one embodiment of the present invention, manufacturing cost can be reduced by omitting an optical filter for suppressing entry of visible light in the case where an infrared light sensor is used.

DETAILED DESCRIPTION OF THE INVENTION

Hereinafter, embodiments of the present invention will be described with reference to the drawings. However, the present invention can be implemented in many different modes, and it is easily understood by those skilled in the art that modes and details of the present invention can be modified in various ways without departing from the spirit and the scope of the present invention. Therefore, the present invention is not construed as being limited to the description of the embodiments. Note that in the structures of the present invention described below, the same reference numerals are used to denote the same portions in different drawings.

Note that the size, layer thickness, and signal waveform of components illustrated in the drawings and the like in embodiments are exaggerated for simplicity in some cases. Therefore, embodiments of the present invention are not limited to such scales.

Note that in this specification, terms such as "first", "second", "third" to "N-th" (N is a natural number) are used in order to avoid confusion between components and do not set a limitation on number.

(Embodiment 1)

In this embodiment, a structure and operation of a photodetector will be described with reference to FIGS. 1A and 1B, FIGS. 2A and 2B, FIGS. 3A and 3B, and FIGS. 4A and 4B.

The structure of the photodetector will be described with reference to FIGS. 1A and 1B. A photodetector 101 includes a first photodiode 102A, a second photodiode 102B, a first amplifier circuit 103A, and a second amplifier circuit 103B.

The first photodiode 102A is a semiconductor element for detecting visible light of visible light and infrared light which enter from the outside. Specifically, a semiconductor layer of the first photodiode 102A is formed of a p-type semiconductor region, an i-type semiconductor region, and an n-type semiconductor region which include amorphous silicon. Note that the semiconductor layer of the first photodiode 102A may be formed of a stack of a p-type semiconductor region and an n-type semiconductor region without provision of an i-type semiconductor region. Amorphous silicon has properties of absorbing much visible light which enters from the outside and transmitting much infrared light which enters from the outside, as compared to crystalline silicon.

Note that the photodiode may be an element that generates photocurrent in accordance with the intensity of light which enters from the outside and thus is sometimes referred to as a photoelectric conversion element.

In this specification, the i-type semiconductor region is a semiconductor region in which an impurity imparting p-type or n-type conductivity is included at a concentration of $1 \times 10^{20}$ cm$^{-3}$ or lower, oxygen and nitrogen are included at a concentration of $5 \times 10^{19}$ cm$^{-3}$ or lower, and the photoconductivity is 100 times or more as high as the dark conductivity. In addition, greater than or equal to 10 ppm and less than or equal to 1000 ppm of boron (B) may be added to the i-type semiconductor region.

The second photodiode 102B is a semiconductor element for detecting infrared light of visible light and infrared light which enter from the outside. Specifically, a semiconductor layer of the second photodiode 102B is formed of a p-type semiconductor region, an i-type semiconductor region, and an n-type semiconductor region which include crystalline silicon. Note that the semiconductor layer of the second photodiode 102B may be formed of a stack of a p-type semiconductor region and an n-type semiconductor region without provision of an i-type semiconductor region. Crystalline silicon has properties of absorbing much infrared light and visible light as compared to amorphous silicon.

Note that it is effective to use a lateral junction photodiode as the second photodiode 102B. With such a structure, the second photodiode 102B, the second transistor 105A, the second transistor 105B, the third transistor 106A, and the third transistor 106B can be formed at the same time. Therefore, the photodetector 101 can be easily manufactured. Specifically, formation of semiconductor layers, impurity regions, and the like in the second photodiode 102B, the second transistor 105A, the second transistor 105B, the third transistor 106A, and the third transistor 106B can be each performed at the same time.

The first amplifier circuit 103A is a circuit for amplifying electric charge accumulated in accordance with photocurrent due to light which enters the first photodiode 102A from the outside, especially visible light, and outputting the amplified electric charge as an electric signal. Specifically, electric charge accumulated in accordance with photocurrent is converted into an amplified electric signal by reset operation, accumulation operation, and selection operation which are performed by a plurality of transistors included in the first amplifier circuit 103A to be output to the outside.

The first amplifier circuit 103A includes a first transistor 104A (also referred to as a transfer transistor), a second transistor 105A (also referred to as an amplifier transistor), and a third transistor 106A (also referred to as a selection transistor). The first photodiode 102A and the first amplifier circuit 103A are controlled by a transfer control line 107 (also referred to as a first wiring), a power supply line 108 (also referred to as a second wiring), a selection control line 109 (also referred to as a third wiring), a first output signal line 110A (also referred to as a fourth wiring), and a reset control line 111 (also referred to as a fifth wiring).

One electrode of the first photodiode 102A is connected to the reset control line 111. The other electrode of the first photodiode 102A is connected to a first terminal of the first transistor 104A. A gate of the first transistor 104A is connected to the transfer control line 107. A second terminal of the first transistor 104A is connected to a gate of the second transistor 105A. A first terminal of the second transistor 105A is connected to the power supply line 108. A second terminal of the second transistor 105A is connected to a first terminal of the third transistor 106A. A gate of the third transistor 106A is connected to the selection control line 109. A second terminal of the third transistor 106A is connected to the first output signal line 110A.

Note that in this specification, description that "A and B are connected to each other" includes the case where A and B are electrically connected to each other in addition to the case where A and B are directly connected to each other. Here, the description that "A and B are electrically connected to each other" means the following case: when an object having any electrical function exists between A and B, a portion between A and B, which includes the object, can be regarded as a node.

Specifically, the description that "A and B are electrically connected to each other" means the case where a portion between A and B can be regarded as one node in consideration of circuit operation; for example, the case where A and B are connected through a switching element such as a transistor and have the same or substantially the same potential by conduction of the switching element, and the case where A and B are connected through a resistor and the potential difference generated at two ends of the resistor does not affect the operation of a circuit including A and B are given.

Note that a transistor is an element having at least three terminals of a gate, a drain, and a source. The transistor includes a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, in this specification, a region functioning as a source or a drain is not called the source or the drain in some cases. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a source region and the other thereof may be referred to as a drain region.

The first transistor 104A is a transistor for transferring electric charge which is accumulated in accordance with photocurrent generated by entry of visible light into the first photodiode 102A to the gate of the second transistor 105A, in response to a signal of the transfer control line 107. The second transistor 105A is a transistor for amplifying current flowing between a source (the second terminal) and a drain (the first terminal) in accordance with a gate potential corresponding to the electric charge which is accumulated in accordance with photocurrent generated by entry of visible light into the first photodiode 102A. The third transistor 106A is a transistor for controlling current flowing between the source and the drain of the second transistor 105A so that the current flows between the power supply line 108 and the first output signal line 110A, in response to a signal of the selection control line 109.

As in the case of the first amplifier circuit 103A, the second amplifier circuit 103B is a circuit for amplifying electric charge accumulated in accordance with photocurrent due to light which enters the second photodiode 102B from the outside, especially infrared light, and outputting the amplified electric charge as an electric signal. Specifically, as in the case of the first amplifier circuit 103A, electric charge accumulated in accordance with photocurrent is converted into an amplified electric signal by reset operation, accumulation operation, and selection operation which are performed by a plurality of transistors included in the second amplifier circuit 103B to be output to the outside.

The second amplifier circuit 103B includes a first transistor 104B (also referred to as a transfer transistor), a second transistor 105B (also referred to as an amplifier transistor), and a third transistor 106B (also referred to as a selection transistor). The second photodiode 102B and the second amplifier circuit 103B are controlled by the transfer control line 107, the power supply line 108, the selection control line 109, a second output signal line 110B (also referred to as a sixth wiring), and the reset control line 111.

Note that the transfer control line 107, the power supply line 108, the selection control line 109, and the reset control line 111, which are connected to the second amplifier circuit 103B, may be wirings different from those connected to the first amplifier circuit 103A. When wirings connected to the second amplifier circuit 103B are different from the wirings connected to the first amplifier circuit 103A, the first amplifier circuit 103A and the second amplifier circuit 103B can be controlled at different timings.

One electrode of the second photodiode 102B is connected to the reset control line 111. The other electrode of the second photodiode 102B is connected to a first terminal of the first transistor 104B. A gate of the first transistor 104B is connected to the transfer control line 107. A second terminal of the first transistor 104B is connected to a gate of the second transistor 105B. A first terminal of the second transistor 105B is connected to the power supply line 108. A second terminal of the second transistor 105B is connected to a first terminal of the third transistor 106B. A gate of the third transistor 106B is connected to the selection control line 109. A second terminal of the third transistor 106B is connected to the second output signal line 110B.

The first transistor 104B is a transistor for transferring electric charge which is accumulated in accordance with photocurrent generated by entry of infrared light into the second photodiode 102B to the gate of the second transistor 105B, in response to a signal of the transfer control line 107. The second transistor 105B is a transistor for amplifying current flowing between a source (the second terminal) and a drain (the first terminal) in accordance with a gate potential corresponding to the electric charge which is accumulated in accordance with photocurrent generated by entry of infrared light into the second photodiode 102B. The third transistor 106B is a transistor for controlling current flowing between the source and the drain of the second transistor 105B so that the current flows between the power supply line 108 and the second output signal line 110B, in response to a signal of the selection control line 109.

Figure 1A:
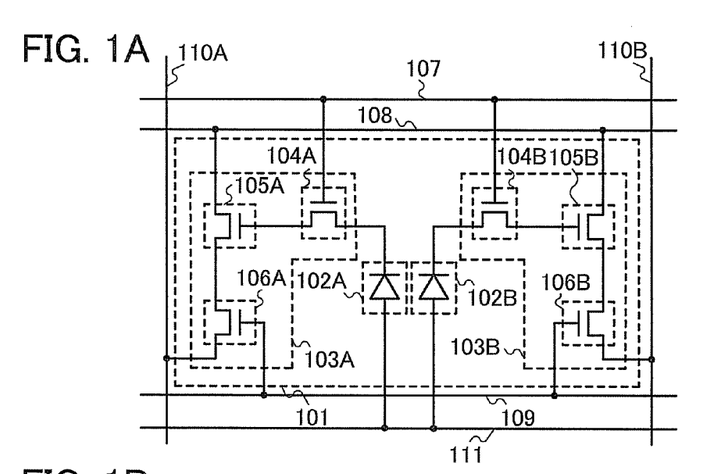
FIGS. 1A and 1B are a circuit diagram and a top view, respectively, according to one embodiment of the present invention.
Figure 1B:
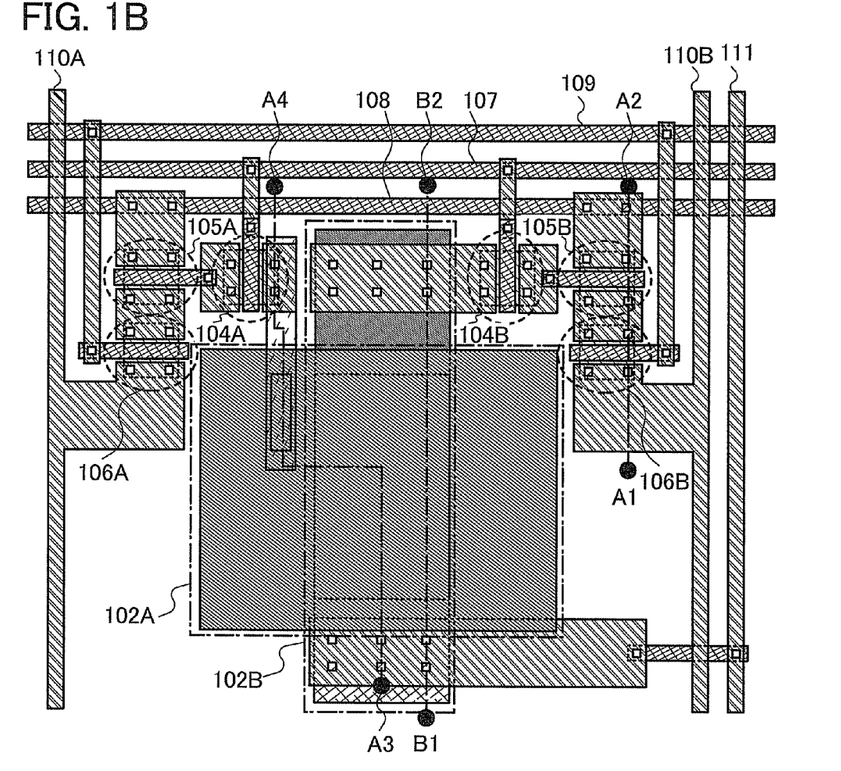

FIG. 1B illustrates one embodiment of the present invention which is a top view of the photodetector 101 illustrated in FIG. 1A. As in FIG. 1A, the first photodiode 102A; the second photodiode 102B; the first transistor 104A, the second transistor 105A, and the third transistor 106A which are included in the first amplifier circuit; and the first transistor 104B, the second transistor 105B, and the third transistor 106B which are included in the second amplifier circuit are illustrated in FIG. 1B. Further, in FIG. 1B, the transfer control line 107, the power supply line 108, the selection control line 109, the first output signal line 110A, the second output signal line 110B, and the reset control line 111 are illustrated as in FIG. 1A.

Although an insulating layer is not illustrated in the top view in FIG. 1B in order to show the arrangement of the wirings and the elements formed using semiconductor layers, an insulating layer or the like is provided as appropriate between conductive layers. The wirings are connected through an opening provided in the insulating layer.

The first photodiode 102A of this embodiment in FIG. 1B is provided over the second photodiode 102B to overlap therewith. Specifically, the first photodiode 102A is provided over the p-type semiconductor region, the i-type semiconductor region, and the n-type semiconductor region which are included in the second photodiode 102B. Preferably, the first photodiode 102A is provided over at least a region serving as the i-type semiconductor region of the second photodiode 102B as illustrated in FIG. 1B.

With the structure in FIG. 1B, in the photodetector in which the first photodiode 102A serving as a visible light sensor and the second photodiode 102B serving as an infrared light sensor are disposed, the area where the sensors are provided can be shared and thus the occupied area can be reduced. As a result, a photodetector in which the pixel size is reduced by reducing the area where the sensors are provided can be provided. Consequently, the area of each sensor can be relatively increased, and thus the sensitivity of the sensors to visible light and infrared light can be improved.

Further, amorphous silicon that is the semiconductor layer of the first photodiode 102A serving as the visible light sensor has properties of absorbing visible light which enters from the outside and transmitting infrared light which enters from the outside. As a result, the structure in FIG. 1B makes it possible to suppress entry of visible light into the second photodiode 102B serving as the infrared light sensor. Accordingly, in the case of providing the second photodiode 102B that detects infrared light with the use of crystalline silicon as a semiconductor layer, an optical filter for reducing noise in detecting infrared light does not need to be additionally provided over the second photodiode 102B; therefore, manufacturing cost can be reduced.

Figure 2A:
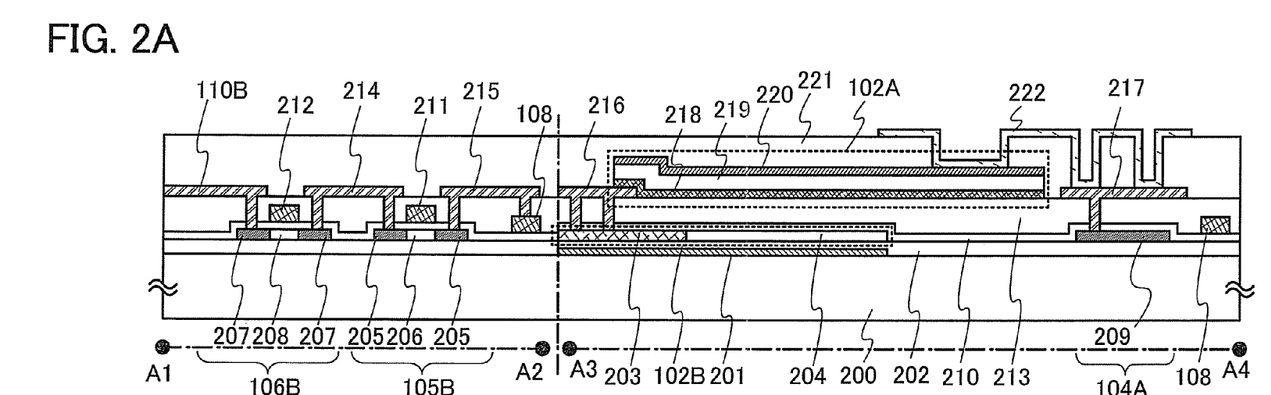
FIGS. 2A and 2B are cross-sectional views according to one embodiment of the present invention.
Figure 2B:
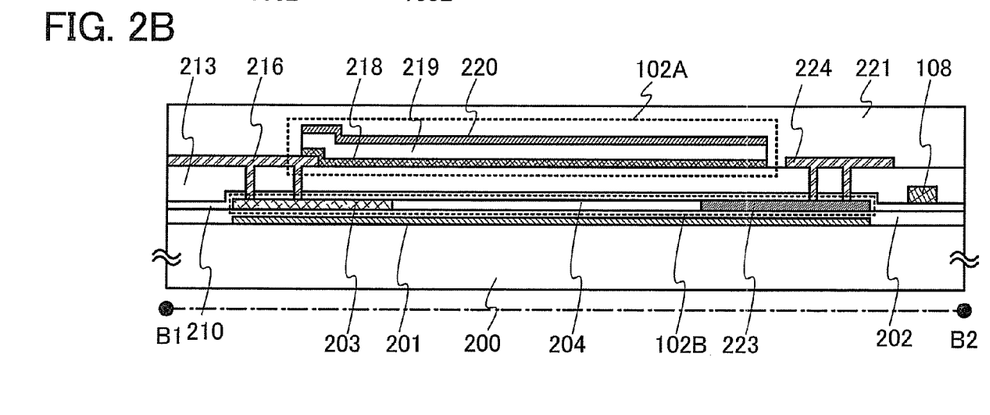

Next, FIG. 2A is a cross-sectional view taken along dashed-dotted line A1-A2 and dashed-dotted line A3-A4 in the top view in FIG. 1B. FIG. 2B is a cross-sectional view taken along dashed-dotted line B1-B2 in the top view in FIG. 1B.

FIG. 2A will be described. In the cross-sectional view in FIG. 2A, a light-blocking layer 201 and a base film 202 are provided over a light-transmitting substrate 200. Over the light-blocking layer 201, over which the base film 202 is provided, a p-type semiconductor region 203 and an i-type semiconductor region 204 in the second photodiode 102B are provided. An n-type semiconductor region 205 and an i-type semiconductor region 206 which form a semiconductor layer of the second transistor 105B are provided in the same layer as a semiconductor layer including the p-type semiconductor region 203 and the i-type semiconductor region 204 in the second photodiode 102B. In a similar manner, an n-type semiconductor region 207 and an i-type semiconductor region 208 which form a semiconductor layer of the third transistor 106B are provided in the same layer as the semiconductor layer including the p-type semiconductor region 203 and the i-type semiconductor region 204 in the second photodiode 102B. In a similar manner, an n-type semiconductor region 209 which forms a semiconductor layer of the first transistor 104A is provided in the same layer as the semiconductor layer including the p-type semiconductor region 203 and the i-type semiconductor region 204 in the second photodiode 102B.

Note that the light-transmitting substrate 200 is preferably a substrate made of a material that transmits visible light and infrared light. For example, a plastic substrate that transmits visible light and infrared light or a glass substrate that transmits visible light and infrared light can be used.

The light-blocking layer 201 prevents infrared light and visible light from a backlight from entering the first photodiode 102A and the second photodiode 102B.

The light-blocking layer 201 is formed in such a manner that a metal material such as aluminum or chromium, which can block infrared light and visible light, is deposited by a sputtering method, a CVD method, or a coating method and then processing is performed by a photolithography method and an etching method. Note that it is preferable that the light-blocking layer 201 be provided not only in a region overlapping with the second photodiode 102B but also in a region overlapping with the semiconductor layers of the transistors included in the first amplifier circuit 103A and the second amplifier circuit 103B. The semiconductor layers of the transistors are shielded by the light-blocking film, whereby deterioration of characteristics, such as shift of the threshold voltage of the transistor, due to entry of infrared light and visible light from the backlight can be prevented. Note that the backlight may have a structure in which a light source that can emit infrared light and visible light from the light-transmitting substrate 200 side is used. Specifically, the backlight may have a structure in which a light-emitting diode that emits infrared light and a light-emitting diode that emits visible light are disposed.

Here, the backlight is provided on the light-transmitting substrate 200 side in order to deliver visible light and infrared light for detection of light to the first photodiode 102A and the second photodiode 102B. Note that infrared light may be separately emitted from a counter substrate side.

The base film 202 prevents an alkali metal such as Na or an alkaline earth metal included in the light-transmitting substrate 200 from diffusing into the second photodiode 102B and adversely affecting the characteristics. The base film 202 is formed by a CVD method, a sputtering method, or the like to have a single-layer or stacked-layer structure using a light-transmitting insulating material such as silicon oxide, silicon nitride, silicon oxynitride, or silicon nitride oxide. Note that a surface of the base film 202 is preferably formed so that the planarity s improved when the semiconductor layer of the second photodiode 102B is formed.

The semiconductor layer of the second photodiode 102B can be formed using crystalline silicon such as polycrystalline silicon. The second photodiode 102B including the semiconductor layer formed using crystalline silicon is provided so that the p-type semiconductor region 203, the i-type semiconductor region 204, and the n-type semiconductor region (not illustrated) are horizontal to the light-transmitting substrate 200. Further, the semiconductor layers of the transistors included in the first amplifier circuit 103A and the second amplifier circuit 103B are formed using crystalline silicon such as polycrystalline silicon, and the n-type semiconductor region 207, the i-type semiconductor region 208, and the n-type semiconductor region 209 are provided therein. The semiconductor layers of the second photodiode 102B and the transistors are formed in the following manner: deposited crystalline silicon is processed by a photolithography method and an etching method; a mask is formed by a photolithography method; and then a p-type or n-type impurity region is formed by an ion implantation method or an ion doping method.

Note that the semiconductor layer of the second photodiode 102B can be formed using crystalline silicon such as single crystal silicon obtained by bonding and separation. First, hydrogen ions ($H^+$, $H_2^+$, $H_3^+$, or the like) or a set of hydrogen ions and helium ions are added into a semiconductor wafer such as a silicon wafer, so that a fragile layer is formed in the semiconductor wafer. The semiconductor wafer is bonded onto the base film 202 and separated along the fragile layer by heat treatment, so that a semiconductor layer is formed on the base film 202. The depth from the surface of the semiconductor wafer to the fragile layer corresponds to the thickness of the semiconductor layer; therefore, the thickness of the semiconductor layer can be adjusted by controlling conditions of the addition of hydrogen ions or the like.

In the cross-sectional view in FIG. 2A, an insulating layer 210 is provided over the semiconductor layer in the second photodiode 102B, the semiconductor layer of the second transistor 105B, the semiconductor layer of the third transistor 106B, and the semiconductor layer of the first transistor 104A. Over the i-type semiconductor region 206, over which the insulating layer 210 is provided, a gate electrode 211 is formed in the same layer as the transfer control line 107, the power supply line 108, and the selection control line 109. Over the i-type semiconductor region 208, over which the insulating layer 210 is provided, a gate electrode 212 is formed in the same layer as the transfer control line 107, the power supply line 108, and the selection control line 109. Over the insulating layer 210, the power supply line 108 is formed in the same layer as the transfer control line 107 and the selection control line 109.

The insulating layer 210 prevents an alkali metal such as Na or an alkaline earth metal from the outside from diffusing into the second photodiode 102B and adversely affecting the characteristics. The insulating layer 210 is formed by a plasma CVD method, a sputtering method, or the like to have a single-layer or stacked-layer structure using a light-transmitting insulating material such as a silicon oxide film, a silicon oxynitride film, a silicon nitride oxide film, or an organic resin film.

Note that a variety of wirings formed in the same layer as the gate electrode 211 and the gate electrode 212 may be formed using a conductive metal material. The wirings are formed to have a single-layer or stacked-layer structure using any of the following as the conductive metal material: metal materials such as molybdenum, titanium, chromium, tantalum, tungsten, aluminum, copper, neodymium, and scandium, and an alloy material which includes any of these materials as a main component. The wirings are formed by a sputtering method or a vacuum evaporation method.

In the cross-sectional view in FIG. 2A, an insulating layer 213 is provided over the insulating layer 210, the gate electrode 211, the gate electrode 212, and the power supply line 108. Between the n-type semiconductor region 205 and the n-type semiconductor region 207, a conductive layer 214 is formed in the same layer as the first output signal line 110A, the second output signal line 110B, and the reset control line 111 through the insulating layer 210 and the insulating layer 213. Over the n-type semiconductor region 207, the second output signal line 110B is formed in the same layer as the first output signal line 110A and the reset control line 111 through the insulating layer 210 and the insulating layer 213. Between the n-type semiconductor region 205 and the power supply line 108, a conductive layer 215 is formed in the same layer as the first output signal line 110A, the second output signal line 110B, and the reset control line 111 through the insulating layer 210 and the insulating layer 213. Over the p-type semiconductor region 203, a conductive layer 216 is formed in the same layer as the first output signal line 110A, the second output signal line 110B, and the reset control line 111 through the insulating layer 210 and the insulating layer 213. Over the n-type semiconductor region 209, a conductive layer 217 is formed in the same layer as the first output signal line 110A, the second output signal line 110B, and the reset control line 111 through the insulating layer 210 and the insulating layer 213.

Note that the insulating layer 213 is formed by a plasma CVD method, a sputtering method, or the like to have a single-layer or stacked-layer structure using a light-transmitting insulating material such as a silicon oxide film, a silicon oxynitride film, a silicon nitride oxide film, or an organic resin film.

The conductive layers 214 to 217 are each formed by a sputtering method or a vacuum evaporation method to have a single-layer or stacked-layer structure using any of the following materials: metal such as molybdenum, titanium, chromium, tantalum, tungsten, aluminum, copper, or yttrium, an alloy material including any of these as a main component, a conductive metal oxide such as indium oxide, and the like.

In the cross-sectional view in FIG. 2A, a p-type semiconductor region 218, an i-type semiconductor region 219, and an n-type semiconductor region 220 in the first photodiode 102A are provided over the insulating layer 213 and the conductive layer 216. Note that the p-type semiconductor region 218 in the first photodiode 102A is provided so that an end portion thereof is stacked over the conductive layer 216.

The semiconductor layer of the first photodiode 102A can be formed using amorphous silicon. The first photodiode 102A including the semiconductor layer formed using amorphous silicon is provided so that the p-type semiconductor region 218, the i-type semiconductor region 219, and the n-type semiconductor region 220 are stacked perpendicularly to the light-transmitting substrate 200.

The p-type semiconductor region 218 is formed using amorphous silicon including an impurity element imparting p-type conductivity. The p-type semiconductor region 218 is formed by a plasma CVD method with the use of a semiconductor source gas including an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The p-type semiconductor region 218 is preferably formed to have a thickness greater than or equal to 10 nm and less than or equal to 50 nm.

The i-type semiconductor region 219 is formed using amorphous silicon. In the formation of the i-type semiconductor region 219, amorphous silicon is deposited by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The i-type semiconductor region 219 is preferably formed to have a thickness greater than or equal to 200 nm and less than or equal to 1000 nm.

The n-type semiconductor region 220 is formed using amorphous silicon including an impurity element imparting n-type conductivity. The n-type semiconductor region 220 is formed by a plasma CVD method with the use of a semiconductor source gas including an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The n-type semiconductor region 220 is preferably formed to have a thickness greater than or equal to 20 nm and less than or equal to 200 nm.

In the cross-sectional view in FIG. 2A, an insulating layer 221 is provided over the first photodiode 102A, the second output signal line 110B, the conductive layer 214, the conductive layer 215, the conductive layer 216, and the conductive layer 217. Between the n-type semiconductor region 220 and the conductive layer 217, a conductive layer 222 is formed in the same layer as a conductive layer serving as a pixel electrode through the insulating layer 221.

Note that the insulating layer 221 is formed by a plasma CVD method, a sputtering method, or the like to have a single-layer or stacked-layer structure using a light-transmitting insulating material such as a silicon oxide film, a silicon oxynitride film, a silicon nitride oxide film, or an organic resin film. It is preferable that the insulating layer 221 be an insulating layer having a planarized surface.

Note that the conductive layer 222 is a light-transmitting conductive layer and formed using a material such as indium tin oxide (ITO), indium tin oxide including silicon oxide (ITSO), or indium zinc oxide (IZO).

Next, FIG. 2B will be described. In the cross-sectional view in FIG. 2B, the light-blocking layer 201 and the base film 202 are provided over the light-transmitting substrate 200. Over the light-blocking layer 201, over which the base film 202 is provided, the p-type semiconductor region 203, the i-type semiconductor region 204, and an n-type semiconductor region 223 in the second photodiode 102B are provided.

In the cross-sectional view in FIG. 2B, the insulating layer 210 is provided over the semiconductor layer in the second photodiode 102B. Over the insulating layer 210, the power supply line 108 is formed in the same layer as the transfer control line 107 and the selection control line 109.

In the cross-sectional view in FIG. 2B, the insulating layer 213 is provided over the insulating layer 210 and the power supply line 108. Over the p-type semiconductor region 203, the conductive layer 216 is formed in the same layer as the first output signal line 110A, the second output signal line 110B, and the reset control line 111 through the insulating layer 210 and the insulating layer 213. Over the n-type semiconductor region 223, a conductive layer 224 is formed in the same layer as the first output signal line 110A, the second output signal line 110B, and the reset control line 111 through the insulating layer 210 and the insulating layer 213.

In the cross-sectional view in FIG. 2B, the p-type semiconductor region 218, the i-type semiconductor region 219, and the n-type semiconductor region 220 in the first photodiode 102A are provided over the insulating layer 213 and the conductive layer 216. Note that the p-type semiconductor region 218 in the first photodiode 102A is provided so that an end portion thereof is stacked over the conductive layer 216.

In the cross-sectional view in FIG. 2B, the insulating layer 221 is provided over the first photodiode 102A, the conductive layer 216, and the conductive layer 224.

Figure 3A:
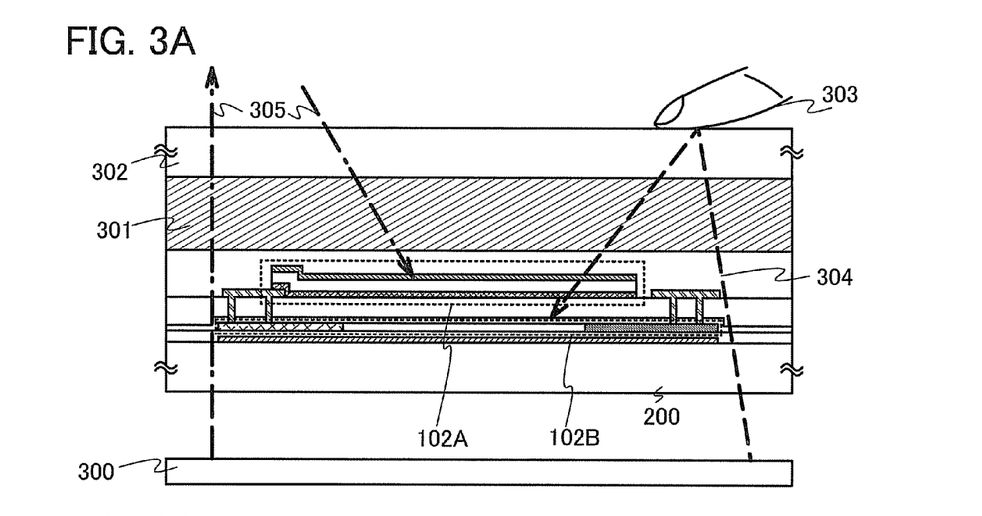
FIGS. 3A and 3B are cross-sectional views according to one embodiment of the present invention.

Next, arrows in FIG. 3A show the state where infrared light and visible light enter the first photodiode 102A and the second photodiode 102B in the cross-sectional views of the photodetector in FIGS. 2A and 2B. FIG. 3A illustrates a backlight 300, a liquid crystal layer 301, a counter substrate 302, and an object to be detected 303 in addition to the first photodiode 102A and the second photodiode 102B. Here, the counter substrate 302 may be a substrate formed using the same material as the light-transmitting substrate 200. Components such as an electrode, a color filter, and a polarizing plate, which are provided for the liquid crystal layer 301, and an alignment film provided as needed are not illustrated here. Note that the backlight 300 in FIG. 3A has a structure in which a light source that can separately emit infrared light and visible light from the light-transmitting substrate 200 side is used. The backlight 300 may have a structure in which a light-emitting diode that emits infrared light and a light-emitting diode that emits visible light are disposed.

Figure 3B:
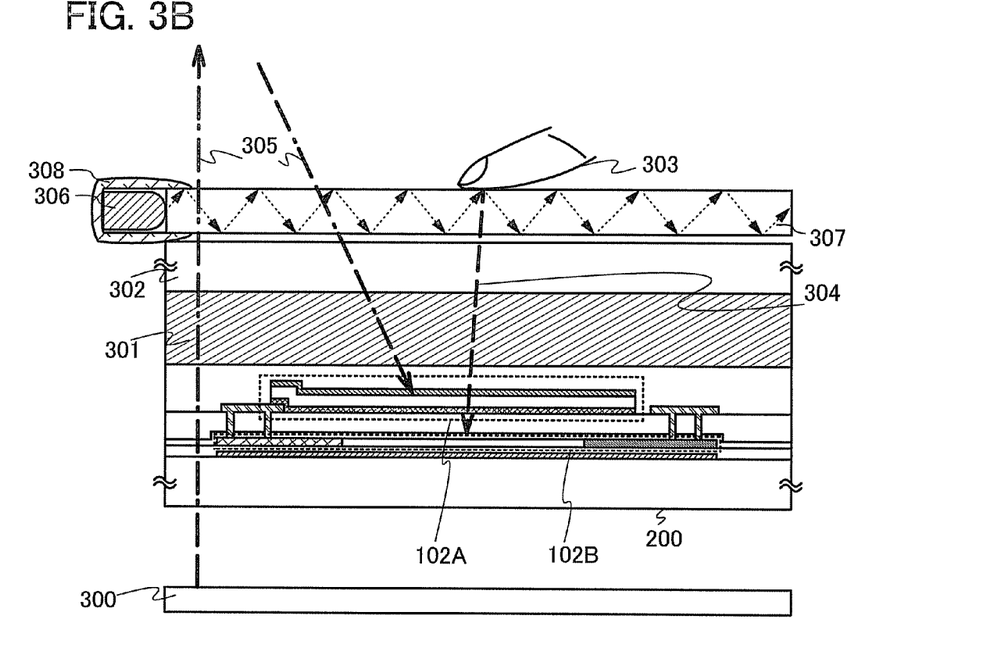

In one embodiment of the present invention, as shown by a dashed arrow 304 in FIGS. 3A and 3B, infrared light from the backlight from the light-transmitting substrate 200 side passes through the liquid crystal layer 301 and then is transmitted through the counter substrate 302. Then, the light transmitted through the counter substrate 302 reflects off a finger which is the object to be detected 303, and enters the counter substrate 302 again. The incident light on the counter substrate 302 enters the second photodiode 102B through the first photodiode 102A. Note that a display device which includes the photodetector according to this embodiment can have an optical touch panel function of detecting an object to be detected such as a finger without an influence of outside light by detecting infrared light with the second photodiode 102B.

Further, in one embodiment of the present invention, as shown by a dashed-dotted arrow 305 in FIGS. 3A and 3B, visible light from the backlight from the light-transmitting substrate 200 side passes through the liquid crystal layer 301 and then is transmitted through the counter substrate 302. Then, the light transmitted through the counter substrate 302 is recognized by a viewer. The visible light enters the first photodiode 102A through the counter substrate 302 and the liquid crystal layer 301. Note that the display device which includes the photodetector according to this embodiment can have a scanner function of detecting an object to be detected such as a color image by detecting visible light with the first photodiode 102A, in addition to the touch panel function which is not influenced by outside light.

FIG. 3B illustrates a structure in which a backlight is different from that in FIG. 3A. The backlight in FIG. 3B includes a light source for emitting visible light; in addition, a front light for emitting infrared light is provided.

The front light illustrated in FIG. 3B includes a light source 306, light guide plate 307, and a fixing member 308. Further, the front light illustrated in FIG. 3B overlaps with the first photodiode 102A and the second photodiode 102B.

As the light source 306, a light-emitting diode that emits infrared light can be used.

The fixing member 308 has a function of fixing the light source 306 and the light guide plate 307. As the fixing member 308, a light-blocking material is preferably used. The use of a light-blocking material as the fixing member 308 can prevent light emitted from the light source 306 from leaking to the outside. Note that the fixing member 308 is not necessarily provided.

In the front light illustrated in FIG. 3B, light from the light source 306 enters the light guide plate 307. For example, in the case where the object to be detected 303 is not in contact with the light guide plate 307, light from the light source 306 is totally reflected in the light guide plate 307. In the case where the object to be detected 303 such as a finger is in contact with the light guide plate 307, light from the light source 306 is scattered in the contact portion between the object to be detected 303 and the light guide plate 307 and enters the second photodiode 102B through the first photodiode 102A.

With the structures in FIGS. 3A and 3B, in the photodetector in which the first photodiode 102A serving as a visible light sensor and the second photodiode 102B serving as an infrared light sensor are disposed, the area where the sensors are provided can be shared and thus the occupied area can be reduced. As a result, a photodetector in which the pixel size is reduced by reducing the area where the sensors are provided can be provided. Consequently, the area of each sensor can be relatively increased, and thus the sensitivity of the sensors to visible light and infrared light can be improved.

Further, amorphous silicon that is the semiconductor layer of the first photodiode 102A serving as the visible light sensor has properties of absorbing visible light which enters from the outside and transmitting infrared light which enters from the outside. As a result, the structures in FIGS. 3A and 3B make it possible to suppress entry of visible light into the second photodiode 102B serving as the infrared light sensor. Accordingly, in the case of providing the second photodiode 102B that detects infrared light with the use of crystalline silicon as a semiconductor layer, an optical filter for reducing noise in detecting infrared light does not need to be additionally provided over the second photodiode 102B; therefore, manufacturing cost can be reduced.

Figure 4A:
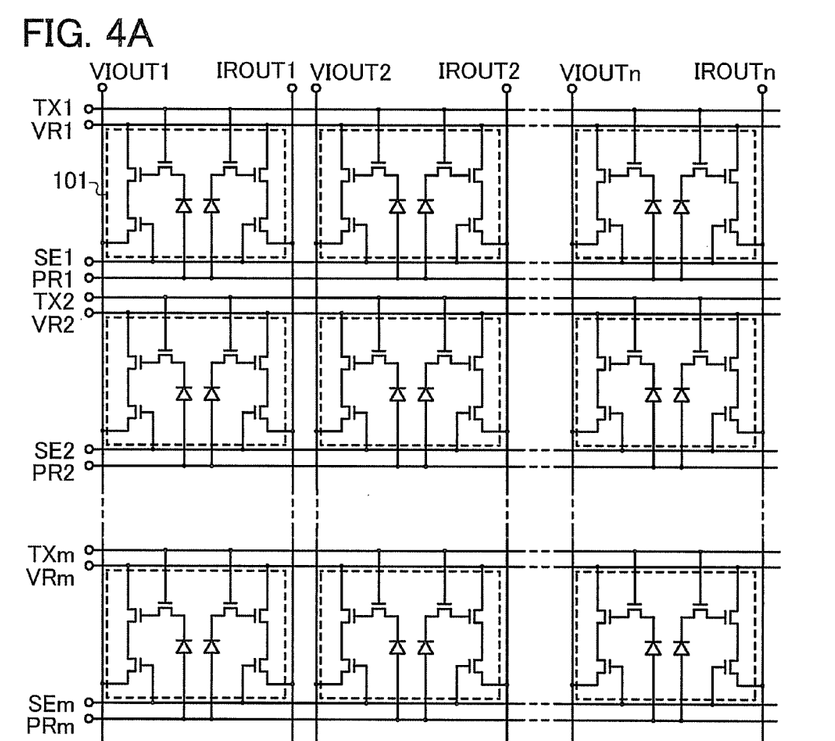
FIGS. 4A and 4B are a circuit diagram and a timing chart, respectively, according to one embodiment of the present invention.

Next, an example of a structure in which a plurality of photodetectors 101 illustrated in FIG. 1 A is provided in matrix is illustrated in FIG. 4A.

In FIG. 4A, the plurality of photodetectors 101 is arranged in a matrix of m rows (m is a natural number of 2 or more) and n columns (n is a natural number of 2 or more). FIG. 4A illustrates an example in which the photodetectors 101 in each row are connected to one of a plurality of reset control lines PR (denoted by wirings PR1 to PRm), one of a plurality of transfer control lines TX (denoted by wirings TX1 to TXm), one of a plurality of selection control lines SE (denoted by wirings SE1 to SEm), and one of a plurality of power supply lines VR (denoted by wirings VR1 to VRm). FIG. 4A illustrates an example in which the photodetectors 101 in each column are connected to one of a plurality of first output signal lines VIOUT (denoted by wirings VIOUT1 to VIOUTn) and one of a plurality of second output signal lines IROUT (denoted by wirings IROUT1 to IROUTn).

In FIG. 4A, the transfer control line TX, the reset control line PR, the selection control line SE, and the power supply line VR are shared by the photodetectors in one row; the first output signal line VIOUT and the second output signal line IROUT are shared by the photodetectors in one column. Without limitation to the above structure, two or more transfer control lines TX may be provided for one row and connected to different photodetectors 101. Two or more reset control lines PR may be provided for one row and connected to different photodetectors 101. Two or more selection control lines SE may be provided for one row and connected to different photodetectors 101. Two or more power supply lines VR may be provided for one row and connected to different photodetectors 101. Two or more first output signal lines VIOUT and/or second output signal lines IROUT may be provided for one column and connected to different photodetectors 101.

FIG. 4A illustrates a structure in which the photodetectors in one row share the wiring VR; however, one embodiment of the present invention is not limited to this. The wiring VR may be shared by the photodetectors in one column.

Figure 4B:
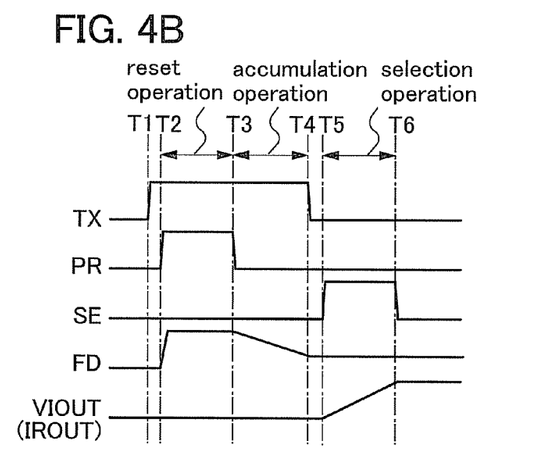

Next, operation of the photodetector 101 will be described. FIG. 4B is an example of a timing chart showing change in the potentials of the wirings illustrated in FIG. 4A (the transfer control line TX, the reset control line PR, the selection control line SE, and the first output signal line VIOUT (the second output signal line IROUT)) and the potential (denoted by FD in FIG. 4B) which corresponds to the potential of the gate of the second transistor 105A (the second transistor 105B). In FIG. 4B, operation of the first photodiode 102A and the first amplifier circuit 103A is the same as operation of the second photodiode 102B and the second amplifier circuit 103B; therefore, the operation of the first photodiode 102A and the first amplifier circuit 103A will be described here.

Note that in the timing chart illustrated in FIG. 4B, for description of the operation of the photodetector 101, it is assumed that the transfer control line TX, the selection control line SE, and the reset control line PR are supplied with a high-level potential or a low-level potential. Specifically, it is assumed that the transfer control line TX is supplied with a high-level potential HTX and a low-level potential LTX; the selection control line SE, a high-level potential HSE and a low-level potential LSE; and the reset signal line PR, a high-level potential HPR and a low-level potential LPR.

Note that the case where the first transistor 104A, the second transistor 105A, and the third transistor 106A are all n-channel transistors will be described. The conductivity type of each of the transistors may be p-type; in this case, the polarity of a signal supplied to each terminal thereof may be inverted.

First, at a time T1, the potential of the transfer control line TX is changed from the potential LTX to the potential HTX. When the potential of the transfer control line TX is changed to the potential HTX, the first transistor 104A is turned on. Note that at the time T1, the selection control line SE is supplied with the potential LSE, and the reset control line PR is supplied with the potential LPR.

At a time T2, the potential of the reset control line PR is changed from the potential LPR to the potential HPR. At the time T2, the potential of the transfer control line TX is kept at the potential HTX, and the potential of the selection control line SE is kept at the potential LSE. Forward bias voltage is applied to the first photodiode 102A. In this manner, since the potential HPR of the reset control line PR is supplied to the gate of the second transistor 105A (FD), electric charge held at the gate of the second transistor 105A (FD) is discharged.

At a time T3, the potential of the reset control line PR is changed from the potential HPR to the potential LPR. Until shortly before the time T3, the potential of the gate of the second transistor 105A (FD) remains at the potential HPR. Thus, when the potential of the reset control line PR is changed to the potential LPR, reverse bias voltage is applied to the first photodiode 102A. Then, when visible light enters the first photodiode 102A in the state where reverse bias voltage is applied to the first photodiode 102A, current (photocurrent) flows in the first photodiode 102A in the direction of the reset control line PR. The value of photocurrent varies in accordance with the intensity of incident light. That is, as the intensity of light which enters the first photodiode 102A is higher, the value of photocurrent is larger and the amount of electric charge transferred between the gate of the second transistor 105A (FD) and the first photodiode 102A is larger. On the other hand, as the intensity of light which enters the first photodiode 102A is lower, the value of photocurrent is smaller and the amount of electric charge transferred between the gate of the second transistor 105A (FD) and the first photodiode 102A is smaller. Thus, the higher the intensity of light becomes, the larger the amount of change in the potential of the gate of the second transistor 105A (FD) becomes; the lower the intensity of light becomes, the smaller the amount of change becomes.

At a time T4, when the potential of the transfer control line TX is changed from the potential HTX to the potential LTX, the first transistor 104A is turned off. Accordingly, transfer of electric charge between the gate of the second transistor 105A (FD) and the first photodiode 102A is stopped, so that the potential of the gate of the second transistor 105A (FD) is determined.

At a time T5, when the potential of the selection control line SE is changed from the potential LSE to the potential HSE, the third transistor 106A is turned on. Then, electric charge is transferred between the wiring VR and the first output signal line VIOUT in accordance with the potential of the node FD.

Note that operation of setting the potential of the first output signal line VIOUT to a predetermined potential (precharge operation) is completed before the time T5. FIG. 4B shows the case where the first output signal line VIOUT is precharged to have a low-level potential before the time T5 and the potential of the first output signal line VIOUT is increased from the time T5 to a time T6 in accordance with the light intensity; however, one embodiment of the present invention is not limited to this. The first output signal line VIOUT may be precharged to have a high-level potential before the time T5 and the potential of the first output signal line VIOUT may be decreased from the time T5 to the time T6 in accordance with the light intensity.

The precharge operation can be conducted in the following manner, for example: the first output signal line VIOUT and a wiring supplied with a predetermined potential are electrically connected to each other through a switching element such as a transistor and the transistor is turned on. After the precharge operation is completed, the transistor is turned off.

At the time T6, when the potential of the selection control line SE is changed from the potential HSE to the potential LSE, the transfer of electric charge from the wiring VR to the first output signal line VIOUT is stopped and thus the potential of the first output signal line VIOUT is determined. This potential of the first output signal line VIOUT corresponds to the potential of an output signal of the photodetector 101. The potential of the output signal includes data on an object to be detected.

The above series of operations of the photodetector 101 can be classified into reset operation, accumulation operation, and selection operation. In other words, the operation from the time T2 to the time T3 corresponds to the reset operation; the operation from the time T3 to the time T4, the accumulation operation; and the operation from the time T5 to the time T6, the selection operation. Furthermore, a period after the accumulation operation is finished and before the selection operation is started, that is, a period from the time T4 to the time T5 corresponds to a charge retention period in which electric charge is held at the gate of the second transistor 105A (FD). Note that as a driving method of a plurality of photodetectors 101, a so-called rolling shutter system can be employed, in which reset operation, accumulation operation, and selection operation are sequentially performed in the photodetectors. As another driving method of a plurality of photodetectors 101, a so-called global shutter system can be employed, in which reset operation and accumulation operation are each performed at the same time and selection operation is sequentially performed in the photodetectors.

Here, when the potential of the transfer control line TX is changed at the time T1 and the time T4, the potential of the gate of the second transistor 105A (FD) is changed by parasitic capacitance between the transfer control line TX and the gate of the second transistor 105A (FD). If the potential of the gate of the second transistor 105A (FD) is largely changed, the output signal cannot be correctly output. A reduction in the capacitance between the gate and source or between the gate and drain of the first transistor 104A is effective in suppressing the change in the potential of the gate of the second transistor 105A (FD) at the time of changing the potential of the transfer control line TX. Further, it is effective to increase the gate capacitance of the second transistor 105A. Furthermore, it is effective to electrically connect a capacitor to the gate of the second transistor 105A (FD). In FIG. 4B, owing to such countermeasures, change in the potential of the gate of the second transistor 105A (FD) at the time of changing the potential of the transfer control line TX is negligible.

Note that it is effective to provide two transfer control lines TX, two reset control lines PR, and two selection control lines SE for the photodetectors 101 in one row so that the operation in the first amplifier circuit 103A and the operation in the second amplifier circuit 103B are independently performed. That is, the following structure is effective: in the photodetector 101, one electrode of the first photodiode 102A is connected to a first reset control line, one electrode of the second photodiode 102B is connected to a second reset control line, a gate of the first transistor 104A is connected to a first transfer control line, a gate of the first transistor 104B is connected to a second transfer control line, a gate of the third transistor 106A is connected to a first selection control line, a gate of the third transistor 106B is connected to a second selection control line, the first transfer control line and the second transfer control line are independently controlled, the first reset control line and the second reset control line are independently controlled, and the first selection control line and the second selection control line are independently controlled. With such a structure, the photodetector 101 can have higher functionality. Note that the following structure may also be used: the operation in the first amplifier circuit 103A and the operation in the second amplifier circuit 103B are independently performed in a first period, and the operation in the first amplifier circuit 103A and the operation in the second amplifier circuit 103B are concurrently performed in a second period.

As an example of the above structure, the photodetector 101 can have a structure in which only detection by the first photodiode 102A is performed. With such a structure, power consumption of the photodetector 101 can be reduced. Specifically, while the reset operation, the accumulation operation, and the selection operation are performed in the first amplifier circuit 103A, at least one of the reset operation, the accumulation operation, and the selection operation is not performed in the second amplifier circuit 103B. Note that the following structure may also be used: only detection by the first photodiode 102A is performed in a first period, and the operation in the first amplifier circuit 103A and the operation in the second amplifier circuit 103B are concurrently performed in a second period.

As another example of the above structure, the photodetector 101 can have a structure in which while the reset operation, the accumulation operation, and the selection operation are performed in the second amplifier circuit 103B, only the accumulation operation is performed in the first amplifier circuit 103A. With such a structure, power consumption of the photodetector 101 can be reduced. Further, since the first photodiode 102A functions as a filter that absorbs light in a particular wavelength range, the accuracy of detection by the second photodiode 102B can be improved. Note that the following structure may also be used: while the reset operation, the accumulation operation, and the selection operation are performed in the second amplifier circuit 103B in a first period, only the accumulation operation is performed in the first amplifier circuit 103A; and the operation in the first amplifier circuit 103A and the operation in the second amplifier circuit 103B are concurrently performed in a second period.

As described above, with the structure of this embodiment, in the photodetector in which the first photodiode serving as a visible light sensor and the second photodiode serving as an infrared light sensor are disposed, the area where the sensors are provided can be shared and thus the occupied area can be reduced. As a result, a photodetector in which the pixel size is reduced by reducing the area where the sensors are provided can be provided. Consequently, the area of each sensor can be relatively increased, and thus the sensitivity of the sensors to visible light and infrared light can be improved.

In the structure of this embodiment, amorphous silicon that is the semiconductor layer of the first photodiode serving as the visible light sensor has properties of absorbing visible light which enters from the outside and transmitting infrared light which enters from the outside. As a result, entry of visible light into the second photodiode serving as the infrared light sensor can be suppressed. Accordingly, in the case of providing the second photodiode that detects infrared light with the use of crystalline silicon as a semiconductor layer, an optical filter for reducing noise due to entry of visible light in detecting infrared light does not need to be additionally provided over the second photodiode; therefore, manufacturing cost can be reduced.

(Embodiment 2)

In this embodiment, an example of a structure of a display device that includes a plurality of display elements arranged in matrix in addition to a plurality of photodetectors arranged in matrix will be described. Such a display device is called an optical touch panel or the like, and a display screen also serves as a data input region. Note that the structures described in Embodiment 1 can be applied to the structure of the photodetector and connection between the photodetectors. In addition, the photodetector can operate in a manner similar to that described in Embodiment 1.

Figure 5:
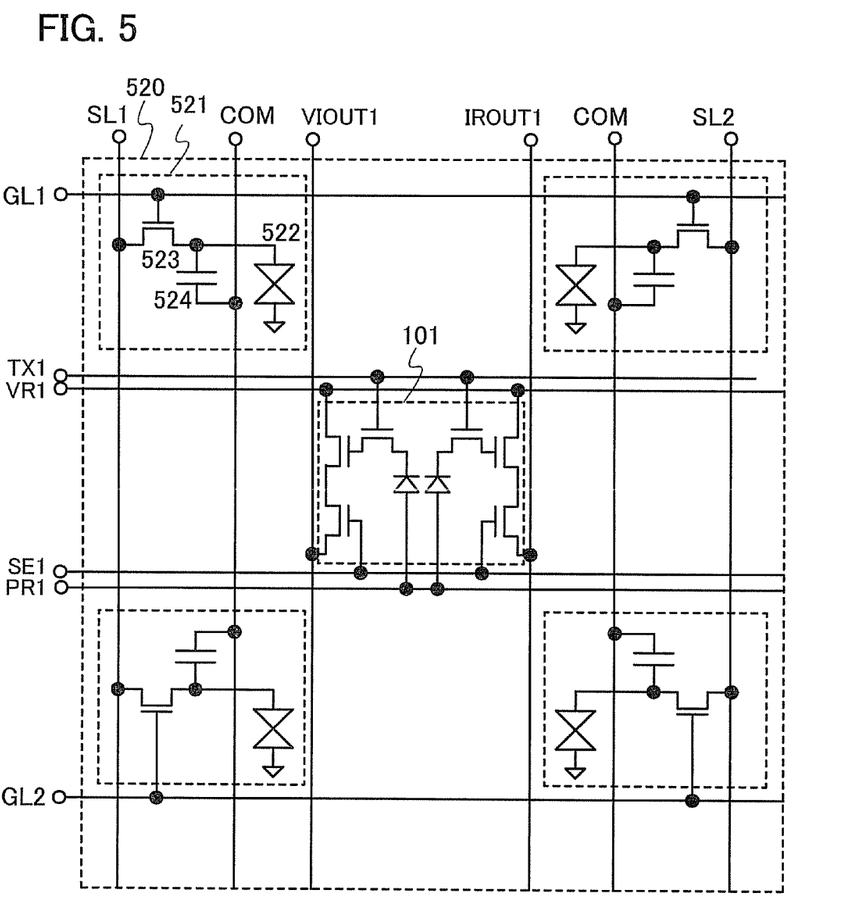
FIG. 5 is a circuit diagram according to one embodiment of the present invention.

FIG. 5 is a circuit diagram of part of a structure of a display device. In FIG. 5, a pixel 520 includes four display elements 521 and one photodetector 101. With the use of the pixel 520 as a basic structure, a plurality of pixels 520 is arranged in a matrix of m rows and n columns and forms a display screen that also serves as a data input region. FIG. 5 illustrates the case where the photodetector 101 having the structure in FIG. 1A is used in the pixel 520. Note that the number of display elements 521 and photodetectors 101 included in each pixel is not limited to that illustrated in FIG. 5. The density of the plurality of photodetectors and that of the plurality of display elements may be the same or different. That is, one photodetector may be provided for one display element; one photodetector may be provided for two or more display elements; or one display element may be provided for two or more photodetectors.

FIG. 5 illustrates a structure in which the display element 521 includes a liquid crystal element 522. The display element 521 includes the liquid crystal element 522 and a circuit element such as a transistor that controls operation of the liquid crystal element 522. Specifically, FIG. 5 illustrates an example in which the display element 521 includes the liquid crystal element 522, a transistor 523 functioning as a switching element, and a capacitor 524. The liquid crystal element 522 includes a pixel electrode, a counter electrode, and a liquid crystal layer to which voltage is applied by the pixel electrode and the counter electrode.

A gate electrode of the transistor 523 is connected to a scan line GL (GL1 or GL2). A first terminal of the transistor 523 is connected to a signal line SL (SL1 or SL2). A second terminal of the transistor 523 is connected to the pixel electrode of the liquid crystal element 522. One of a pair of electrodes of the capacitor 524 is connected to the pixel electrode of the liquid crystal element 522, and the other thereof is connected to a wiring COM supplied with a fixed potential. The signal line SL is supplied with a potential for an image to be displayed. When the transistor 523 is turned on with a signal of the scan line GL, the potential of the signal line SL is supplied to one of the pair of the electrodes of the capacitor 524 and the pixel electrode of the liquid crystal element 522. The capacitor 524 holds electric charge corresponding to voltage applied to the liquid crystal layer. Contrast (grayscale) of light transmitted through the liquid crystal layer is controlled using change in the polarization direction of the liquid crystal layer with voltage application, and an image is displayed. As the light transmitted through the liquid crystal layer, visible light emitted from a backlight is used.

In the structure in FIG. 5, operation of the display elements arranged in matrix can be similar to that in a known display device.

Note that the transistor 523 is preferably manufactured in the same manufacturing process as a transistor included in the photodetector 101. As a result, the manufacturing process of the display device can be simplified.

This embodiment can be freely combined with any of the other embodiments.

(Embodiment 3)

A photodetector according to one embodiment of the present invention is characterized in that the sensitivity of a sensor can be improved and manufacturing cost can be reduced.

The photodetector according to one embodiment of the present invention can be applied to display devices, laptop computers, or image reproducing devices provided with recording media (typically, devices which reproduce the content of recording media such as digital versatile discs (DVDs) and have displays for displaying the reproduced images). Further, examples of electronic devices to which the photodetector according to one embodiment of the present invention can be applied include mobile phones, portable game machines, portable information terminals, e-book readers, cameras such as video cameras or digital still cameras, goggle-type displays (head mounted displays), navigation systems, audio reproducing devices (such as car audio systems or digital audio players), copiers, facsimiles, printers, multifunction printers, automated teller machines (ATMs), and vending machines. Specific examples of these electronic devices are illustrated in FIGS. 6A to 6D.

Figure 6A:
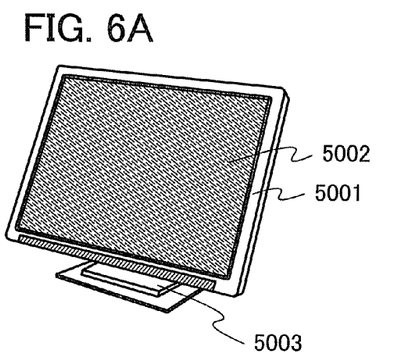
FIGS. 6A to 6D illustrate electronic devices in Embodiment 3.

FIG. 6A illustrates a display device including a housing 5001, a display portion 5002, a supporting base 5003, and the like. The photodetector according to one embodiment of the present invention can be used for the display portion 5002. By using the photodetector according to one embodiment of the present invention for the display portion 5002, a display device in which the sensitivity of a sensor is improved and whose manufacturing cost is reduced can be provided. Note that the display device includes all display devices for displaying information, such as display devices for personal computers, display devices for receiving TV broadcasts, and display devices for displaying advertisements.

Figure 6B:
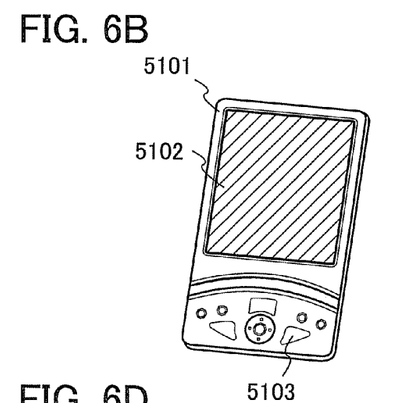

FIG. 6B illustrates a portable information terminal including a housing 5101, a display portion 5102, an operation key 5103, and the like. The photodetector according to one embodiment of the present invention can be used for the display portion 5102. By using the photodetector according to one embodiment of the present invention for the display portion 5102, a portable information terminal in which the sensitivity of a sensor is improved and whose manufacturing cost is reduced can be provided.

Figure 6C:
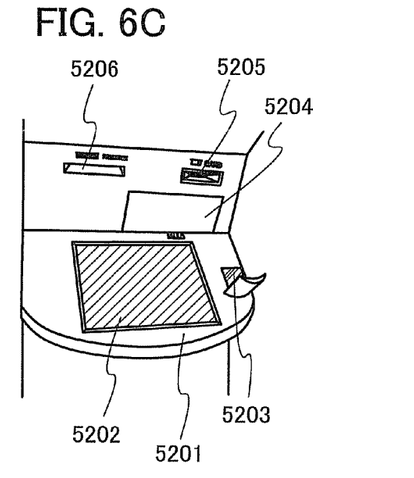

FIG. 6C illustrates an automated teller machine including a housing 5201, a display portion 5202, a coin slot 5203, a bill slot 5204, a card slot 5205, a bankbook slot 5206, and the like. The photodetector according to one embodiment of the present invention can be used for the display portion 5202. By using the photodetector according to one embodiment of the present invention for the display portion 5202, an automated teller machine in which the sensitivity of a sensor is improved and whose manufacturing cost is reduced can be provided.

Figure 6D:
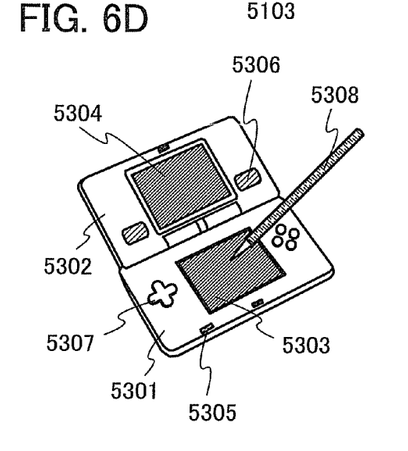

FIG. 6D illustrates a portable game machine including a housing 5301, a housing 5302, a display portion 5303, a display portion 5304, a microphone 5305, a speaker 5306, an operation key 5307, a stylus 5308, and the like. The photodetector according to one embodiment of the present invention can be used for the display portion 5303 or the display portion 5304. By using the photodetector according to one embodiment of the present invention for the display portion 5303 or the display portion 5304, a portable game machine in which the sensitivity of a sensor is improved and whose manufacturing cost is reduced can be provided. Note that although the portable game machine illustrated in FIG. 6D includes two display portions 5303 and 5304, the number of display portions included in the portable game machine is not limited to this.

This embodiment can be combined with any of the above embodiments as appropriate.

(Embodiment 4)

In any of the structures disclosed in Embodiment 1, transistors whose off-state current is extremely low are preferably used as the first transistor 104A and the first transistor 104B. With such a structure, properties of retaining electric charge accumulated in accordance with photocurrent in the first photodiode 102A and the second photodiode 102B can be improved. Accordingly, the detection accuracy of the photodetector 101 can be improved. The above structure is particularly preferable in the case where a global shutter system is employed as a driving method of a plurality of photodetectors because the charge retention period differs among the photodetectors. In order to form the transistors whose off-state current is extremely low, for example, oxide semiconductor layers including an oxide semiconductor that is a wide-gap semiconductor are preferably used as the semiconductor layers of the first transistor 104A and the second transistor 104B.

As an oxide semiconductor used for the above oxide semiconductor layers, any of the following can be used: a four-component metal oxide such as an In-Sn-Ga-Zn-based oxide; three-component metal oxides such as an In-Ga-Zn-based oxide, an In-Sn-Zn-based oxide, an In-Al-Zn-based oxide, a Sn-Ga-Zn-based oxide, an Al-Ga-Zn-based oxide, a Sn-Al-Zn-based oxide, an In-Hf-Zn-based oxide, an In-La-Zn-based oxide, an In-Ce-Zn-based oxide, an In-Pr-Zn-based oxide, an In-Nd-Zn-based oxide, an In-Sm-Zn-based oxide, an In-Eu-Zn-based oxide, an In-Gd-Zn-based oxide, an In-Tb-Zn-based oxide, an In-Dy-Zn-based oxide, an In-Ho-Zn-based oxide, an In-Er-Zn-based oxide, an In-Tm-Zn-based oxide, an In-Yb-Zn-based oxide, and an In-Lu-Zn-based oxide; two-component metal oxides such as an In-Zn-based oxide, a Sn-Zn-based oxide, an Al-Zn-based oxide, a Zn-Mg-based oxide, a Sn-Mg-based oxide, an In-Mg-based oxide, and an In-Ga-based oxide; indium oxide; tin oxide; zinc oxide; and the like. In addition, the above materials may include $SiO_2$. Here, for example, an In-Ga-Zn-based oxide means an oxide including indium (In), gallium (Ga), and zinc (Zn), and there is no particular limitation on the composition ratio thereof. Further, the In-Ga-Zn-O-based oxide may include an element other than In, Ga, and Zn. Note that the oxide semiconductor layer may be either single crystal or non-single-crystal. In the case of non-single-crystal, the oxide semiconductor layer may be either amorphous or polycrystalline. Further, the oxide semiconductor layer may have either an amorphous structure including a portion having crystallinity or a non-amorphous structure.

In any of the structures disclosed in Embodiment 1, in the case where the semiconductor layers of the first transistor 104A and the second transistor 104B are formed using an oxide semiconductor, the following structure can be used: for example, the second photodiode 102B, the second transistor 105A, the second transistor 105B, the third transistor 106A, and the third transistor 106B are formed over a substrate; a first insulating film is formed over the second photodiode 102B, the second transistor 105A, the second transistor 105B, the third transistor 106A, and the third transistor 106B; the first transistor 104A and the first transistor 104B are formed over the first insulating film; a second insulating film is formed over the first transistor 104A and the first transistor 104B; and the first photodiode 102A is formed over the second insulating film.

This embodiment can be combined with any of the above embodiments as appropriate.

This application is based on Japanese Patent Application serial no. 2010-227467 filed with the Japan Patent Office on Oct. 7, 2010, the entire contents of which are hereby incorporated by reference.

What is claimed is:

1. A photodetector comprising:
   a first sensor comprising a first photodiode, a first transistor, and a second transistor;
   a second sensor comprising a second photodiode, a third transistor, and a fourth transistor; and
   an insulating film over the second photodiode, the first transistor, the second transistor, the third transistor, and the fourth transistor,
   wherein the first photodiode overlaps with the second photodiode with the insulating film provided therebetween,
   wherein the first photodiode comprises a first semiconductor,
   wherein the second photodiode comprises a second semiconductor,
   wherein the first photodiode and the second photodiode overlap with each other,
   wherein a gate of the second transistor is electrically connected to a first terminal of the first transistor,
   wherein a gate of the fourth transistor is electrically connected to a first terminal of the third transistor,
   wherein a second terminal of the first transistor is electrically connected to a first electrode of the first photodiode, and
   wherein a second terminal of the third transistor is electrically connected to a first electrode of the second photodiode.

2. The photodetector according to claim 1,
   wherein the first semiconductor comprises amorphous silicon,
   wherein the second semiconductor comprises crystalline silicon,
   wherein the first transistor comprises the same semiconductor as the second photodiode, and
   wherein the second transistor comprises the same semiconductor as the second photodiode.

3. The photodetector according to claim 2,
   wherein the first photodiode comprises a p-type semiconductor region, an i-type semiconductor region, and an n-type semiconductor region, and
   wherein the p-type semiconductor region, the i-type semiconductor region, and the n-type semiconductor region are stacked.

4. The photodetector according to claim 3,
   wherein the second photodiode comprises a p-type semiconductor region, an i-type semiconductor region, and an n-type semiconductor region,
   wherein the first photodiode overlaps with a region of the second photodiode, and
   wherein an area of the region is larger than an area of the i-type semiconductor region.

5. The photodetector according to claim 4, wherein the second semiconductor is provided over a glass substrate or a plastic substrate.

6. The photodetector according to claim 1,
   wherein the first sensor comprises a fifth transistor,
   wherein the second sensor comprises a sixth transistor, wherein the second transistor and the fifth transistor are electrically connected in series between a power supply line and a first output signal line, wherein the fourth transistor and the sixth transistor are electrically connected in series between the power supply line and a second output signal line, wherein a second electrode of the first photodiode and a second electrode of the second photodiode are electrically connected to a reset signal line, wherein a gate of the first transistor and a gate of the third transistor are electrically connected to a transfer control line, and wherein a gate of the fifth transistor and a gate of the sixth transistor are electrically connected to a selection control line.

7. An electronic device comprising the photodetector according to claim 6.

8. A photodetector comprising:
a first sensor comprising a first photodiode, a first transistor, a second transistor, and a third transistor; and
a second sensor comprising a second photodiode, a fourth transistor, a fifth transistor, and a sixth transistor,
wherein the first photodiode comprises a first semiconductor,
wherein the second photodiode comprises a second semiconductor,
wherein the first photodiode is configured to absorb visible light of an incident light and transmit infrared light of the incident light,
wherein the second photodiode is configured to absorb infrared light of the incident light transmitted through the first photodiode,
wherein the first photodiode and the second photodiode overlap with each other,
wherein a gate of the second transistor is electrically connected to a first terminal of the first transistor,
wherein a gate of the fifth transistor is electrically connected to a first terminal of the fourth transistor,
wherein a second terminal of the first transistor is electrically connected to a first electrode of the first photodiode,
wherein a second terminal of the fourth transistor is electrically connected to a first electrode of the second photodiode,
wherein the second transistor and the third transistor are electrically connected in series between a power supply line and a first output signal line,
wherein the fifth transistor and the sixth transistor are electrically connected in series between the power supply line and a second output signal line,
wherein a second electrode of the first photodiode and a second electrode of the second photodiode are electrically connected to a reset signal line,
wherein a gate of the first transistor and a gate of the fourth transistor are electrically connected to a transfer control line, and
wherein a gate of the third transistor and a gate of the sixth transistor are electrically connected to a selection control line.

9. The photodetector according to claim 8,
wherein the first transistor comprises the same semiconductor as the second photodiode, and
wherein the second transistor comprises the same semiconductor as the second photodiode.

10. The photodetector according to claim 9,
wherein the first photodiode comprises a p-type semiconductor region, an i-type semiconductor region, and an n-type semiconductor region, and
wherein the p-type semiconductor region, the i-type semiconductor region, and the n-type semiconductor region are stacked.

11. The photodetector according to claim 10,
wherein the second photodiode comprises a p-type semiconductor region, an i-type semiconductor region, and an n-type semiconductor region,
wherein the first photodiode overlaps with a region of the second photodiode, and
wherein an area of the region is larger than an area of the i-type semiconductor region.

12. The photodetector according to claim 11, wherein the second semiconductor is provided over a glass substrate or a plastic substrate.

13. An electronic device comprising the photodetector according to claim 8.

14. The photodetector according to claim 8, further comprising an insulating film over the second photodiode, the first transistor, the second transistor, the third transistor, and the fourth transistor,
wherein the first photodiode overlaps with the second photodiode with the insulating film provided therebetween.

15. A display device comprising:
a photodetector over a substrate, the photodetector comprising:
a first sensor comprising a first photodiode, a first transistor, and a second transistor;
a second sensor comprising a second photodiode, a third transistor, and a fourth transistor; and
an insulating film over the second photodiode, the first transistor, the second transistor, the third transistor, and the fourth transistor; and
a display element over the substrate, the display element comprising:
a liquid crystal element,
wherein the first photodiode overlaps with the second photodiode with the insulating film provided therebetween,
wherein the first photodiode comprises a first semiconductor,
wherein the second photodiode comprises a second semiconductor,
wherein the first photodiode and the second photodiode overlap with each other,
wherein a gate of the second transistor is electrically connected to a first terminal of the first transistor,
wherein a gate of the fourth transistor is electrically connected to a first terminal of the third transistor,
wherein a second terminal of the first transistor is electrically connected to a first electrode of the first photodiode, and
wherein a second terminal of the third transistor is electrically connected to a first electrode of the second photodiode.

16. The display device according to claim 15,
wherein the first semiconductor comprises amorphous silicon,
wherein the second semiconductor comprises crystalline silicon,
wherein the display element comprises a fifth transistor,
wherein the first transistor comprises the same semiconductor as the second photodiode, and
wherein the second transistor comprises the same semiconductor as the second photodiode.

17. The display device according to claim 16,
wherein the first photodiode comprises a p-type semiconductor region, an i-type semiconductor region, and an n-type semiconductor region, and
wherein the p-type semiconductor region, the i-type semiconductor region, and the n-type semiconductor region are stacked.

18. The display device according to claim 17,
wherein the second photodiode comprises a p-type semiconductor region, an i-type semiconductor region, and an n-type semiconductor region,
wherein the first photodiode overlaps with a region of the second photodiode, and
wherein an area of the region is larger than an area of the i-type semiconductor region.

19. The display device according to claim 18, wherein the substrate is a glass substrate or plastic substrate.

20. The display device according to claim 15,
wherein the first sensor comprises a fifth transistor,
wherein the second sensor comprises a sixth transistor,
wherein the second transistor and the fifth transistor are electrically connected in series between a power supply line and a first output signal line,
wherein the fourth transistor and the sixth transistor are electrically connected in series between the power supply line and a second output signal line,
wherein a second electrode of the first photodiode and a second electrode of the second photodiode are electrically connected to a reset signal line,
wherein a gate of the first transistor and a gate of the third transistor are electrically connected to a transfer control line, and
wherein a gate of the fifth transistor and a gate of the sixth transistor are electrically connected to a selection control line.

21. An electronic device comprising the display device according to claim 20.

* * * * *